United States Patent
Mei et al.

(10) Patent No.: US 12,105,301 B2
(45) Date of Patent: Oct. 1, 2024

(54) METHOD FOR MANUFACTURING MULTI-STAGE COMPOUND EYE LENS

(71) Applicant: Xi'an Jiaotong University, Xi'an (CN)

(72) Inventors: Xuesong Mei, Xi'an (CN); Wenjun Wang, Xi'an (CN); Jiang Li, Xi'an (CN); Aifei Pan, Xi'an (CN); Bin Liu, Xi'an (CN); Jianlei Cui, Xi'an (CN)

( * ) Notice: Subject to any disclaimer, the term of this patent is extended or adjusted under 35 U.S.C. 154(b) by 299 days.

(21) Appl. No.: 17/758,304

(22) PCT Filed: Aug. 28, 2020

(86) PCT No.: PCT/CN2020/112203
§ 371 (c)(1),
(2) Date: Jul. 1, 2022

(87) PCT Pub. No.: WO2021/143148
PCT Pub. Date: Jul. 22, 2021

(65) Prior Publication Data
US 2023/0027509 A1    Jan. 26, 2023

(30) Foreign Application Priority Data
Jan. 19, 2020 (CN) .......................... 202010058570.1

(51) Int. Cl.
    *G02B 3/00*      (2006.01)
    *C23C 14/08*      (2006.01)
    (Continued)

(52) U.S. Cl.
    CPC .......... *G02B 3/0012* (2013.01); *C23C 14/086* (2013.01); *C23C 14/34* (2013.01); *G03F 7/0002* (2013.01); *G03F 7/162* (2013.01)

(58) Field of Classification Search
CPC ..... G02B 3/0012; C23C 14/086; C23C 14/34; G03F 7/162; G03F 7/0002
See application file for complete search history.

(56) References Cited

U.S. PATENT DOCUMENTS

| | | | |
|---|---|---|---|
| 6,391,800 B1* | 5/2002 | Redd | G03F 7/16 438/782 |
| 2010/0151126 A1* | 6/2010 | Iseki | H01L 21/6715 118/695 |

OTHER PUBLICATIONS

Wang ("Fabrication of Hierarchial Micro/Nano Compound Eyes," ACS Appl. Mater. Interfaces, 2019, 11, 34507-34516) (Year: 2019).*
Duan (English Translation of CN109655945) (Year: 2019).*

* cited by examiner

Primary Examiner — Michael A Tolin
Assistant Examiner — Hana C Page
(74) Attorney, Agent, or Firm — Novoclaims Patent Services LLC; Mei Lin Wong

(57) ABSTRACT

A method for manufacturing a multi-stage compound eye lens includes the steps of manufacturing a micropillar array using a photoetching method, then sputtering ZnO on the surface of the micropillar array, jet printing an ultraviolet curing adhesive onto gaps in the micropillar array using a micro jet printing machine, and controlling the morphology of microlens using the number of droplet dropping instances to obtain a microlens array; further respectively dissolving hexamethyl tetramine and zinc nitrate in deionized water, then pouring the hexamethyl tetramine solution into the zinc nitrate solution to obtain a mixed solution, placing the microlens array into the mixed solution, and placing is in a water bath kettle for a water bath, and finally, removing the microlens array from the mixed solution, rinsing it with deionized water, and drying same to obtain the multi-stage compound eye lens.

1 Claim, 3 Drawing Sheets

(51) Int. Cl.
*C23C 14/34* (2006.01)
*G03F 7/00* (2006.01)
*G03F 7/16* (2006.01)

METHOD FOR MANUFACTURING MULTI-STAGE COMPOUND EYE LENS

BACKGROUND OF THE PRESENT INVENTION

Field of Invention

The present invention relates to a technical field of micro-nano manufacturing process, and more particularly to a method for manufacturing a multi-stage compound eye lens.

Description of Related Arts

The compound eyes of insects in nature are composed of numerous ommatidium structures, wherein there are a plurality of villus structures in the gaps between the ommatidium structures. This configuration has the advantage of having super hydrophobicity for the compound eyes of insects to greatly increase survivability of insects in harsh environments, such as rainy days and foggy days. During the manufacturing process of a lens with the compound eye structure, the surface of a single microlens array has strong adhesion and poor hydrophobicity, which is quite different from the ommatidium structure of insects in nature. Meanwhile, optical signals will interfere with each other after passing through the lens under large luminous flux. The micro-pillar array can improve the surface hydrophobicity, however, the droplets have poor stability on the surface of the sample. A slight vibration can make the droplets fill the gaps of the micro-pillar array, so as to make the droplets with greater adhesion. The preparation of nanostructures on the surface of the structure can effectively improve the hydrophobicity and the stability of the droplets on the surface. On the other hand, the nanostructures will affect the light transmittance of the microlens.

SUMMARY OF THE PRESENT INVENTION

In order to solve the above problems, an objective of the present invention is to provide a method for manufacturing a multi-stage compound eye lens, wherein under a condition of reducing a crosslinking of an optical signal, the hydrophobicity of the structure surface and the stability of droplets can be greatly improved, and it is difficult for the droplets to fill the gap of the micropillar array. The nanostructure of the microlens gaps can reduce the light transmittance and reduce crosslinking between optical signals.

In order to achieve the above objective, the technical solution of the present invention is attained by:

a method for manufacturing a multi-stage compound eye lens, which comprises the following steps:

1) Manufacture a micropillar array using a photoetching method: Spin-coat a photoresist 4620 on a glass slide, wherein a spin-coating speed is 1500 r/s, wherein the glass slide is placed on a drying table for 5 minutes, and repeatedly spin-coat the photoresist on the glass substrate to obtain a microporous array with a thickness of about 22 μm, which is a sample 1; after turning over the sample 1 twice by PDMS, obtain a microporous array mold, which is a sample 2; pour NOA61 UV-curable adhesive on PDMS of a surface of the sample 2, press it on a glass substrate, and then expose it by the UV exposure machine for 100 s, and demold the micro-pillar array with a height of about 22 μm to obtain a sample 3.

2) Sputter 30 nm of ZnO on a surface of the sample 3 to obtain a sample 4. Jet-print an ultraviolet curing adhesive onto gaps in the micropillar array using a micro jet printing machine. Control a morphology of microlenses using the number of droplets. The number of droplets is 2-12. A sample 5 with a microlens array is obtained.

3) Dissolve 7 g of hexamethyl tetramine and 14.87 g of zinc nitrate in deionized water respectively and stir for 20 minutes. Then, pour the hexamethyl tetramine solution into the zinc nitrate solution, and mix and stir for 15 minutes to obtain a mixed solution. Place the sample 5 into the mixed solution and place it in a water bath at 90° C. for 80 minutes to obtain a sample 6.

4) Rinse the sample 6 with deionized water for 2 minutes and dry it on a drying table at 60° C. for 50 minutes to obtain the multi-stage compound eye lens.

The present invention has the following advantages. According to the present invention, the microlens array can be accurately positioned by the micro-jet printer, wherein the microlens array is prepared in the gap of the micropillar array. The ZnO seed layer can be formed for covering on the surface by the jet-printing method, wherein the nanostructure can be fully covered except for the location of the microlens. The micropillar array can effectively improve the surface hydrophobicity, however the stability of the micropillar array is poor, wherein a slight vibration can make the droplets fill the gap of the micropillar array, and the nanostructure on the top of the micropillar array can greatly improve the structural stability. Meanwhile, the gap nanostructure in the base microlens array can effectively reduce the light transmittance and prevent the mutual influence of optical signals, especially in the condition of strong optical signals.

DETAILED DESCRIPTION OF THE PREFERRED EMBODIMENT

Figure 1:
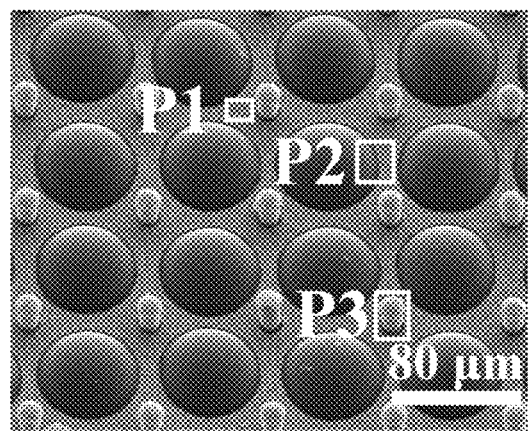
FIG. 1 is an electron microscope image of a multi-stage compound eye lens according to a first embodiment of the present invention.
Figure 2:
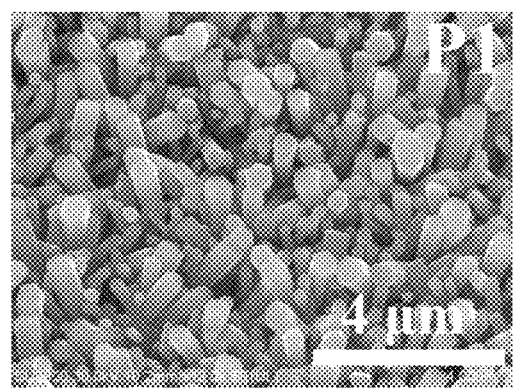
FIG. 2 is a structural view of the multi-stage compound eye lens in P1 portion of FIG. 1.
Figure 3:
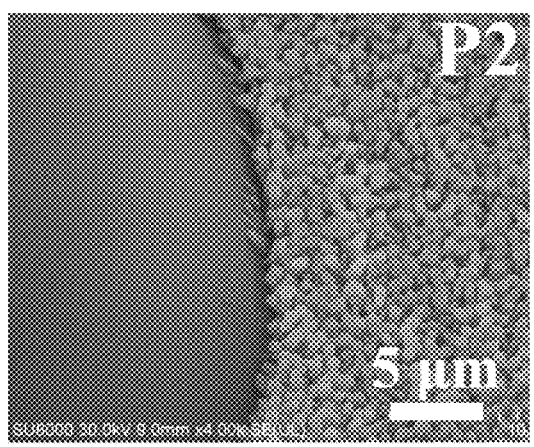
FIG. 3 is a structural view of the multi-stage compound eye lens in P2 portion of FIG. 1.
Figure 4:
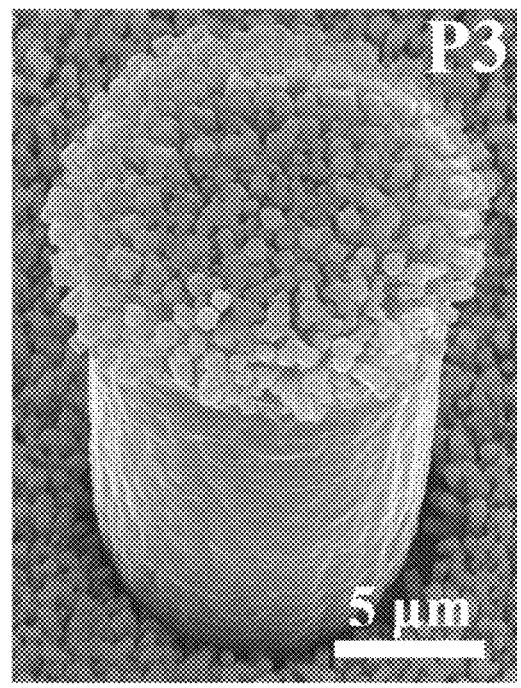
FIG. 4 is a structural view of the multi-stage compound eye lens in P3 portion of FIG. 1.

The present invention will be further described below with reference to the accompanying drawings and embodiments.

Embodiment 1: a method for manufacturing a multi-stage compound eye lens comprises the following steps.

1) Manufacture a micropillar array using a photoetching method: Spin-coat a photoresist 4620 on a glass slide, wherein a spin-coating speed is 1500 r/s, wherein the glass slide is placed on a drying table for 5 minutes, and repeatedly spin-coat the photoresist on the glass substrate to obtain a microporous array with a thickness of 22 μm, which is a sample 1; after turning over the sample 1 twice by PDMS, obtain a microporous array mold, which is a sample 2; pour NOA61 UV-curable adhesive on PDMS of a surface of the sample 2, press it on a glass substrate, and then expose it by the UV exposure machine for 100 s, and demold the micro-pillar array with a height of 22 μm to obtain a sample 3.

2) Sputter 30 nm of ZnO on a surface of the sample 3 to obtain a sample 4. Jet-print an ultraviolet curing adhesive onto gaps in the micropillar array using a micro jet printing machine. Control a morphology of microlenses using the number of droplets. The number of droplets is 12. A sample 5 with a microlens array is obtained.

3) Dissolve 7 g of hexamethyl tetramine and 14.87 g of zinc nitrate in deionized water respectively and stir for 20 minutes. Then, pour the hexamethyl tetramine solution into the zinc nitrate solution, and mix and stir for 15 minutes to obtain a mixed solution. Place the sample 5 into the mixed solution and place it in a water bath at 90° C. for 80 minutes to obtain a sample 6.

4) Rinse the sample 6 with deionized water for 2 minutes and dry it on a drying table at 60° C. for 50 minutes to obtain the multi-stage compound eye lens.

Figure 5:
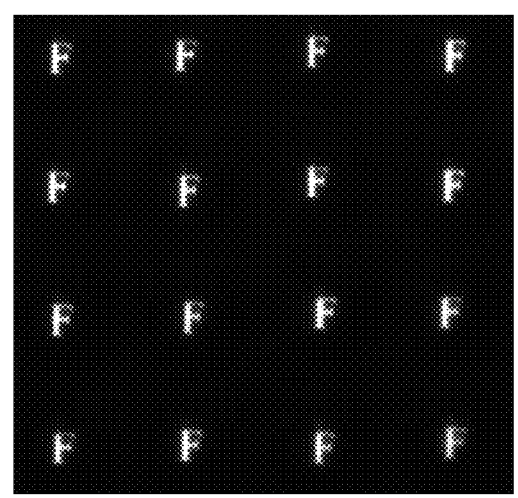
FIG. 5 is an imaging diagram of the multi-stage compound eye lens according to the first embodiment the present invention.

Referring to FIGS. 1, 2, 3 and 4, the multi-stage compound eye lens obtained by the embodiment has super hydrophobic properties, wherein when the droplet contacts the multi-stage compound eye lens, the droplet can be quickly separated from the multi-stage compound eye lens. The conventional lens with the superhydrophobic structure will affect its light transmittance. According to the method of the present invention, since the nanostructure and the micropillar array are fabricated in the microlens gap, such configuration will not affect the imaging of the compound eye lens, as shown in FIG. 5. This structure can significantly enhance the practical application of the compound eye lens.

Figure 6:
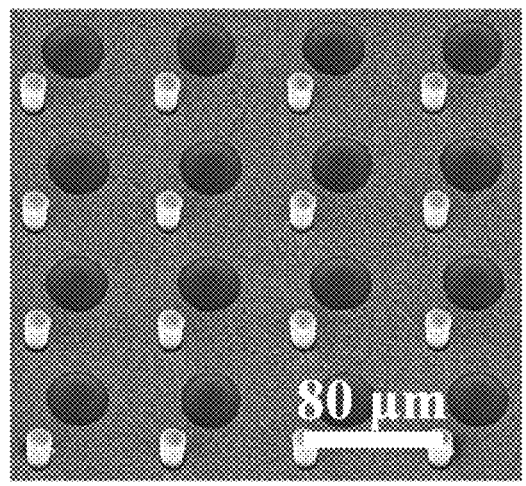
FIG. 6 is an electron microscope image of a multi-stage compound eye lens according to a second embodiment of the present invention.

Embodiment 2: The number of droplets in step 2) of the Embodiment 1 is changed to 2, wherein other steps are the same to obtain a multi-stage compound eye lens with the structure similar to that of Embodiment 1, as shown in FIG. 6.

Figure 7:
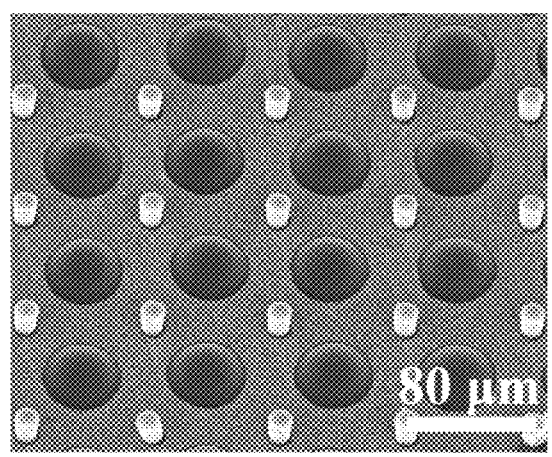
FIG. 7 is an electron microscope image of a multi-stage compound eye lens according to a third embodiment of the present invention.

Embodiment 3: The number of droplets in step 2) of the Embodiment 1 is changed to 4, wherein other steps are the same to obtain a multi-stage compound eye lens with the structure similar to that of Embodiment 1, as shown in FIG. 7.

Figure 8:
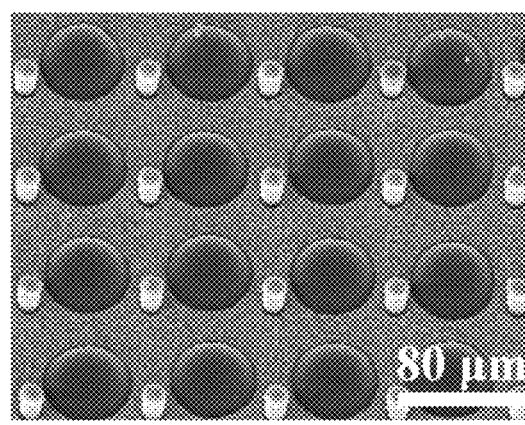
FIG. 8 is an electron microscope image of a multi-stage compound eye lens according to a fourth embodiment of the present invention.

Embodiment 4: The number of droplets in step 2) of the Embodiment 1 is changed to 8, wherein other steps are the same to obtain a multi-stage compound eye lens with the structure having triple-stage compound structure similar to that of Embodiment 1, as shown in FIG. 8.

What is claimed is:

1. A method for manufacturing a multi-stage compound eye lens, comprising the steps of:
   1) manufacturing a micropillar array using a photoetching method: spin-coating a photoresist 4620 on a glass slide, wherein a spin-coating speed is 1500 r/s, wherein the glass slide is placed on a drying table for 5 minutes, and repeatedly spin-coating the photoresist on the glass slide to obtain a microporous array with a thickness of 22 μm, which is a sample 1; after turning over the sample 1 twice by PDMS, obtaining a microporous array mold of PDMS, which is a sample 2; pouring NOA61 UV-curable adhesive on a surface of the sample 2, pressing it on the glass slide, and then exposing it by a UV exposure machine for 100 s, and demolding the micropillar array with a height of 22 μm to obtain a sample 3;
   2) sputtering 30 nm of ZnO on a surface of the sample 3 to obtain a sample 4, jet-printing an ultraviolet curing adhesive onto gaps in the micropillar array using a micro jet printing machine, and controlling a morphology of microlenses using 2-12 number of droplets, and obtaining a sample 5 with a microlens array;
   3) dissolving 7 g of hexamethyl tetramine and 14.87 g of zinc nitrate in deionized water respectively and stir for 20 minutes to obtain a hexamethyl tetramine solution and a zinc nitrate solution respectively, then pouring the hexamethyl tetramine solution into the zinc nitrate solution, and mixing and stirring for 15 minutes to obtain a mixed solution, and placing the sample 5 into the mixed solution and placing it in a water bath at 90° C. for 80 minutes to obtain a sample 6; and
   4) rinsing the sample 6 with deionized water for 2 minutes and drying it on a drying table at 60° ° C. for 50 minutes to obtain the multi-stage compound eye lens.

\* \* \* \* \*